United States Patent
Singhal et al.

(10) Patent No.: US 11,560,314 B2
(45) Date of Patent: Jan. 24, 2023

(54) SYSTEM AND METHOD FOR SYNTHESIS OF GRAPHENE QUANTUM DOTS

(71) Applicant: LOG 9 MATERIALS SCIENTIFIC PRIVATE LIMITED, Saharanpur (IN)

(72) Inventors: Akshay Vivek Singhal, Saharanpur (IN); Anshul Kumar Sharma, Kangra (IN)

(73) Assignee: LOG 9 MATERIALS SCIENTIFIC PRIVATE LIMITED, Uttar Pradesh (IN)

( * ) Notice: Subject to any disclaimer, the term of this patent is extended or adjusted under 35 U.S.C. 154(b) by 68 days.

(21) Appl. No.: 16/959,130

(22) PCT Filed: Dec. 27, 2018

(86) PCT No.: PCT/IN2018/050890
§ 371 (c)(1),
(2) Date: Jun. 29, 2020

(87) PCT Pub. No.: WO2019/130353
PCT Pub. Date: Jul. 4, 2019

(65) Prior Publication Data
US 2020/0339425 A1    Oct. 29, 2020

(30) Foreign Application Priority Data
Dec. 27, 2017   (IN) .............................. 201711022372

(51) Int. Cl.
*C23C 16/26*   (2006.01)
*C01B 32/186*   (2017.01)
(Continued)

(52) U.S. Cl.
CPC ............ *C01B 32/186* (2017.08); *C23C 16/01* (2013.01); *C23C 16/26* (2013.01); *C23C 16/40* (2013.01);
(Continued)

(58) Field of Classification Search
CPC ....................................................... C23C 16/26
See application file for complete search history.

(56) References Cited

PUBLICATIONS

"One-step synthesis of graphene quantum dots from defective CVD graphene and their application in IGZO UV thin film phototransistor", Huihui Zhu, Ao Liu, Fukai Shan, Wenrong Yang, Carbon, 100, 201-207, (Year: 2016).*

* cited by examiner

*Primary Examiner* — David P Turocy
(74) *Attorney, Agent, or Firm* — Barry Choobin; Patent 360 LLC

(57) ABSTRACT

The embodiments herein provide a system and a method for the synthesis of Graphene Quantum Dots (GQDs) for use in applications like nano-electronics, photonics, bio-imaging, energy storage, quantum computing, etc. Cu substrate is placed inside the CVD tube, and the CVD Chamber is sealed. The process parameters for CVD process are set up. Precursor gases injected inside the tube are dissociate to form carbon dimers and trimmers. Upon cooling semi-cyrstalline carbon film deposits inside the CVD tube. Oxidizing gas mixture is injected to convert amorphous C in semi-cyrstalline carbon film to $CO_2/CO$. Graphene Quantum Dots (GQDs) so formed are carried with the gas flow and deposited at the cooler end of tube. The scrapper assembly is inserted in the CVD Tube and the reagent is sprayed inside the tube to disperse these GQDs in the reagent. This dispersion is pumped out of the CVD Chamber.

6 Claims, 3 Drawing Sheets

(51) Int. Cl.
  *C23C 16/01* (2006.01)
  *C23C 16/40* (2006.01)
  *C23C 16/56* (2006.01)
  *B82Y 30/00* (2011.01)
  *B82Y 40/00* (2011.01)
(52) U.S. Cl.
  CPC ............... *C23C 16/56* (2013.01); *B82Y 30/00* (2013.01); *B82Y 40/00* (2013.01)

SYSTEM AND METHOD FOR SYNTHESIS OF GRAPHENE QUANTUM DOTS

CROSS-REFERENCE TO RELATED APPLICATIONS

The present application is a national phase application filed in continuation of the PCT application PCT/IN 2018/050890 filed on Dec. 27, 2018 with the tile, "SYSTEM AND METHOD FOR SYNTHESIS OF GRAPHENE QUANTUM DOTS" and claims the priority of the PCT application and the contents of which is included entirely as reference herein. The present application further claims the priority of the Indian Provisional Patent Application (PPA) with serial number 201711022372 filed on Jun. 27, 2017 and subsequently Post-dated by 6 months to Dec. 27, 2017 with the title, "SYSTEM AND METHOD FOR SYNTHESIS OF GRAPHENE QUANTUM DOTS" and subsequently post-dated by six months. The contents of abovementioned PPA are included in entirety as reference herein.

BACKGROUND

Technical Field

The embodiments herein are generally related to the field of nanotechnology. The embodiments herein are particularly related to graphene nanotechnology and synthesis of graphene derivatives. The embodiments herein are more particularly related to a system and a method for the synthesis of Graphene Quantum Dots (GQDs) using a Chemical Vapor Deposition (CVD) Technique for use in optoelectronics, drug delivery, energy storage, quantum computing and bio-imaging applications/industries.

Description of the Related Art

Recently graphene quantum dots (GQDs) have attracted attention of researches due to unique properties. GQDs are zero dimensional nanomaterial with chemically stable, transparent, low toxicity, and large surface area properties. GQDs are found to exhibit photoluminescence, tunable functionality and shows prominent quantum confinement effect. GQDs have been studied for various applications such as optoelectronics, drug delivery, energy storage application, quantum computing and bio imaging. Several processes used for a synthesis of GQDs include electrochemical, chemical vapor deposition, microwave, hydrothermal, solution, ultrasonic method, etc.

Hydrothermal technique is one of the most commonly used techniques for the synthesis of GQDs. In this method, GQDs are produced under high temperature and pressure through a reaction between $H_2O_2$ and GO. The reaction is carried out in Teflon sealed SS autoclave. At high temperature and pressure, $H_2O_2$ dissociates into —OH radicals, which further assists to cut down GO to GQDs. The excess $H_2O_2$ needs to be removed through a catalytic decomposition process. This method has several disadvantages such as non-uniform size distribution, high pressure synthesis, low yield and removal of $H_2O_2$ from the system.

A microwave assisted hydrothermal method provides a better route to synthesize GQDs compared to hydrothermal method supplemented by a microwave assisted pyrolysis of glucose which subsequently transforms to GQDs. GQDs synthesized/acquired through this method contain residual hydroxyl, carboxyl or carbonyl groups, thereby damaging/hampering PL behavior and electrical performance. Although, the reaction requires lesser purification processes, the yield is quite low.

Deflagration reaction of PTFE and Si has been used to produce GQDs in a gram scale. In this process, a dried mixture of PTFE and Si nanoparticles mixed with cyclohexane undergoes combustion in a stainless steel setup with electrical detonator. After removal of Si, the black powder obtained in this process is further oxidized and exfoliated via modified Hummer's method to obtain GQDs. This method is quite time consuming as the method involves multiple steps for purification and exfoliation of GQDs is carried out in a harsh acidic media.

Pulse laser ablation technique (PLA) is another technique, which has been employed to obtain GQDs. PLA is used to generate highly non-equilibrium conditions in liquids with high temperature and pressure, thereby leading to a growth of fragmented species. Pulse laser ablation technique is used to reduce multi walled carbon nanotubes (MWCNTs) suspension in hexane to colloidal GQDs. Although this method is fast, simple and used to obtain a quite homogeneous size of GQDs, the method requires MWCNTs as the precursor thereby adding/increasing to manufacturing cost. Further, a continuous synthesis of GQDs is difficult and sophisticated laser pulse set-up is required.

Hence, there is a need for a continuous, rapid and scalable method for production of highly pure graphene quantum dots with very narrow size distribution. There is also a need for a method for production of highly pure graphene quantum dots without involving high-end sophisticated synthesis methods such as plasma laser ablation or any harsh acidic medium such as $H_2SO_4/HNO_3$.

The abovementioned shortcomings, disadvantages and problems are addressed herein, which will be understood by reading and studying the following specification.

OBJECTIVES OF THE EMBODIMENTS HEREIN

The primary object of the embodiments herein is to provide a system and method for a synthesis of highly pure graphene quantum dots using CVD technique.

Another object of the embodiments herein is to provide a synthesis with processes executed in three broad stages automatically in succession thereby leading to a continuous synthesis of GQDs in the CVD Chamber Yet another object of the embodiments herein is to provide a system and method for the synthesis of that the GQDs to directly obtain GQDs in dispersion form for readily used in an application without a need for purification.

Yet another object of the embodiments herein is to provide a system and method for the synthesis of GQDs in a low vacuum condition in CVD Chamber with a chamber pressure in a range of 0.1 to 100 torr.

Yet another object of the embodiments herein to provide a system and method for the synthesis of GQDs using gases like Methane ($CH_4$), Acetylene ($C_2H_2$), Propane ($C_3H_8$), etc., as the only source of carbon for synthesis of GQDs.

Yet another object of the embodiments herein is to provide a system and method for the synthesis of the GQDs to form/generate a semi-crystalline carbon coating/film as an intermediary product, which is then partially oxidized to obtain GQDs.

Yet another object of the embodiments herein is to provide a system and method for the synthesis of the GQDs in which the semi-crystalline coating/film is partially oxidized using very low flow rate of Oxygen ($O_2$) gas under vacuum in the CVD Chamber.

Yet another object of the embodiments herein is to provide a system and method for the synthesis of the GQDs, in which the GQDs are dissolved directly from the cooler/cooled end of the CVD tube into a dispersion using external agents like cooling fans and solvents like Water, Acetone, Ethanol or mixture thereof.

Yet another object of the embodiments herein is to provide a system and method for the synthesis of the GQDs to produce GQDs with narrow size distribution in terms of particle diameter, and to control the diameter of the GQDs precisely with a tolerance level of less than 20% when compared to the desired size.

Yet another object of the embodiments herein is to provide a system and method for a synthesis of highly pure graphene quantum dots with a purity level of more than 90% using CVD technique.

Yet another object of the embodiments herein is to provide a system and method for a synthesis of highly pure graphene quantum dots with a thickness of 0.5 to 4 nm and a surface diameter of 2 to 80 nm.

These and other objects and advantages of the embodiments herein will become readily apparent from the following detailed description taken in conjunction with the accompanying drawings.

SUMMARY

The following details present a simplified summary of the embodiments herein to provide a basic understanding of the several aspects of the embodiments herein. This summary is not an extensive overview of the embodiments herein. It is not intended to identify key/critical elements of the embodiments herein or to delineate the scope of the embodiments herein. Its sole purpose is to present the concepts of the embodiments herein in a simplified form as a prelude to the more detailed description that is presented later.

The other objects and advantages of the embodiments herein will become readily apparent from the following description taken in conjunction with the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

The embodiments herein provide a system and a method for a synthesis of high purity Graphene Quantum Dots (GQDs) using Chemical Vapor Deposition (CVD) technique which is a high throughput process.

According to one embodiment herein, the method for the synthesis of high purity Graphene Quantum Dots (GQDs) comprises three broad stages/major processes. The three stages/processes include a Film Formation Stage process, Partial Oxidation of film process/stage, and Dispersion of GQDs process/stage. These stages/processes are executed/performed in succession automatically, so that the entire synthesis method of GQDs carried out in a continuous and automatic manner in the CVD Chamber.

According to one embodiment herein, the method for the synthesis of high purity Graphene Quantum Dots (GQDs) using CVD technique is provided. A strip of catalytic substrate such as Cu or Ni substrate is placed inside the CVD tube/chamber and the CVD Chamber is sealed to start a film formation process. Then the required process parameters for a CVD process are setup. The CVD tube/chamber is heated to a temperature 1000° C.-1100° C. by a furnace element. The CVD tube/chamber is maintained under a vacuum condition of up to 1 torr by a vacuum line. A mixture of precursor gases is injected into the CVD tube/chamber through a gas injection end (gas injection port). According to an embodiment herein, the mixture of Carbonaceous gases is injected into the CVD tube/Chamber. The mixture of carbonaceous gases is a mixture of gases selected from a group consisting of Methane, Acetylene, propane mixed with Hydrogen and Argon. The Carbonaceous gases are dissociated under temperature and pressure to form carbon dimers and carbon trimmers. The furnace elements are switched off and the insulation formed around the furnace insulation is removed to cool the CVD tube/chamber rapidly. The carbon dimers and carbon trimmers start to condense on the Cu or Ni substrate to form a semi-crystalline carbon film/coating upon a cooling of the CVD tube/chamber. The semi-crystalline carbon film is deposited inside the CVD tube/chamber upon cooling. This semi-crystalline carbon film has a short range in the order/terms of crystallinity, having small graphite regions embedded into an amorphous matrix. The Furnace Elements are switched on again to maintain a temperature of the CVD tube/chamber in the range of 600-900° C. during a partial oxidation of film process. An oxidizing gas mixture containing a mixture of Oxygen gas and Argon gas is injected into the CVD Tube/chamber to oxidize the amorphous regions of the semi-crystalline carbon film, to convert amorphous Carbon in semi-crystalline carbon film into $CO_2$/CO thereby leading to a formation GQDs. The GQDs, thus formed, are carried with the gas flow and are deposited in the fan-cooled end/region of CVD tube/chamber thereby forming a GQD Film. A Scrapper coupled with a reagent hose and a dispersion hose are inserted into a Gas Exit End of the CVD tube/chamber during a film dispersion process. A dispersion reagent is pumped into the CVD tube/chamber from the Reagent Tank with the reagent hose and the reagent is sprayed on the GQD Film. According an embodiment herein, the reagent is selected from a group consisting of water, ethanol, acetone, and a mixture thereof. The scrapper is now rotated to disperse the GQDs in the reagent solution. The dispersed GQDs are pumped out into the Dispersion Tank through the Dispersion Hose. The entire process is then repeated starting from Film Formation Stage to dispersion stage to obtain continuous supply of GQDs.

According to one embodiment herein, the GQDs are directly obtained in the dispersion form by dissolution of GQDs layer, which is deposited in the cooled end/region of the CVD tube/chamber at the end of partial oxidation process, using analytical reagents like water, ethanol, acetone, etc. or mixture thereof. Therefore, there is no need for further purification of this dispersion and is ready for use in subsequent applications. The GQDs so obtained have a narrow size distribution in terms of their sheet diameter.

According to one embodiment herein, the pressure within the CVD Chamber/tube during the Film Formation process is maintained between 1 to 100 torr, which is substantially higher than the conventional CVD process for graphene synthesis. This enables a higher concentration of dissociated carbon dimers and trimers within the CVD tube. The disassociated carbon dimers and carbon trimers are condensed on the walls of the CVD tube upon rapid cooling of the CVD tube to form a carbon film. The carbon film so formed is semi-crystalline in nature and is an intermediate product of the process.

According to one embodiment herein, the carbon film deposited within the CVD tube is partially oxidized using very low flow rate of Oxygen gas (O2) under vacuum conditions leading to a conversion of amorphous carbon regions in the film into CO or CO2, and a deposition of crystalline portions of the film as GQDs at the cooled ends/regions of the CVD tube/chamber.

According to an embodiment herein, a system for synthesizing for the synthesis of high purity Graphene Quantum Dots (GQDs) using CVD technique is provided. The system comprises a CVD Apparatus provided with a Quartz Tube or CVD Tube/Chamber having a Gas Injection End and a gas exit end. The tube is surrounded by Furnace/Heating Elements. A Furnace Insulation pad is formed around the furnace heating elements. The furnace insulation pads are retracted/removed mechanically or manually. The gas exit end of the CVD tube is provided with a cooled region. The cooled region is cooled by a fab or by circulating coolants around the region. A scrapper is provided inside the CVD tube at the gas exit end and are rotated mechanically. The scrapper is coupled with a reagent supply hose and a dispersion hose. The regent supply hose and the dispersion hose are arranged coaxially. The regent supply hose and the dispersion hose are connected to a reagent supply tank and to a GQD dispersion tank respectively.

According to an embodiment herein, a strip of catalytic substrate is placed in the CVD tube/Chamber. According to an embodiment herein, the catalytic substrate is Cu or Ni. The chamber is then sealed with lids to carry out a film formation process a partial oxidation process of the film. Then the required process parameters for a CVD process are setup. The process parameters includes maintain a temperature of the tube at 1100° C. and a vacuum pressure of 0.1-100 torr inside the CVD tube/chamber. According to an embodiment herein, the Furnace Elements are activated to heat up the CVD Chamber/tube up to temperature of 1100° C. The CVD tube/chamber is maintained under a vacuum condition of 0.1-100 torr by a vacuum line.

According to an embodiment herein, precursor gases are injected from the gas injection end of the tube and the exit gases are pumped out of the CVD Tube through a Vacuum Line End. A mixture of precursor gases is injected into the CVD tube/chamber through a gas injection end (gas injection port). According to an embodiment herein, the mixture of Carbonaceous gases is injected into the CVD tube/Chamber. The mixture of carbonaceous gases is a mixture of gases selected from a group consisting of Methane, Acetylene, propane mixed with Hydrogen and Argon. The Carbonaceous gases are dissociated under temperature and pressure to form carbon dimers and carbon trimmers. The furnace elements are switched off and the insulation formed around the furnace insulation is removed to cool the CVD tube/chamber rapidly. The carbon dimers and carbon trimmers start to condense on the Cu or Ni substrate to form a semi-crystalline carbon film/coating upon a cooling of the CVD tube/chamber. The semi-crystalline carbon film is deposited inside the CVD tube/chamber upon cooling. This semi-crystalline carbon film has a short range in the order/terms of crystallinity, having small graphite regions embedded into an amorphous matrix.

According to an embodiment herein, the Furnace Elements are switched on again to maintain a temperature of the CVD tube/chamber in the range of 600-90° C. during a partial oxidation of film process. An oxidizing gas mixture containing a mixture of Oxygen gas and Argon gas is injected into the CVD Tube/chamber to oxidize the amorphous regions of the semi-crystalline carbon film, to convert amorphous Carbon in semi-crystalline carbon film into CO2/CO thereby leading to a formation GQDs. The GQDs, thus formed, are carried with the gas flow and are deposited in the fan-cooled end/region of CVD tube/chamber thereby forming a GQD Film.

According to an embodiment herein, the Scrapper coupled with a reagent hose and a dispersion hose are inserted into a Gas Exit End of the CVD tube/chamber during a film dispersion process. A dispersion reagent is pumped into the CVD tube/chamber from the Reagent Tank through the reagent hose and the reagent is sprayed on the GQD Film. According an embodiment herein, the reagent is selected from a group consisting of water, ethanol, acetone, and a mixture thereof. The scrapper is now rotated to disperse the GQDs in the reagent solution. The dispersed GQDs are pumped out into the Dispersion Tank through the Dispersion Hose. The entire process is then repeated starting from Film Formation Stage to dispersion stage to obtain continuous supply of GQDs.

According to an embodiment herein, the cooled region/end of the CVD tube/chamber is cooled with the external fan or by circulating a coolant around the cooled region/end of the tube.

According to an embodiment herein, the purity level of graphene quantum dots with the system and method is more than 90%.

According to an embodiment herein, a thickness of the pure graphene quantum dots is 0.5 to 4 nm and a surface diameter of the pure graphene quantum dots is 2 to 80 nm.

According to an embodiment herein, the GQDs so obtained have narrow size distribution in terms of their sheet diameter with less than 20% tolerance in desired size.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments.

It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

BRIEF DESCRIPTION OF THE DRAWINGS

The other objects, features and advantages will occur to those skilled in the art from the following description of the preferred embodiment and the accompanying drawings in which.

Figure 1:
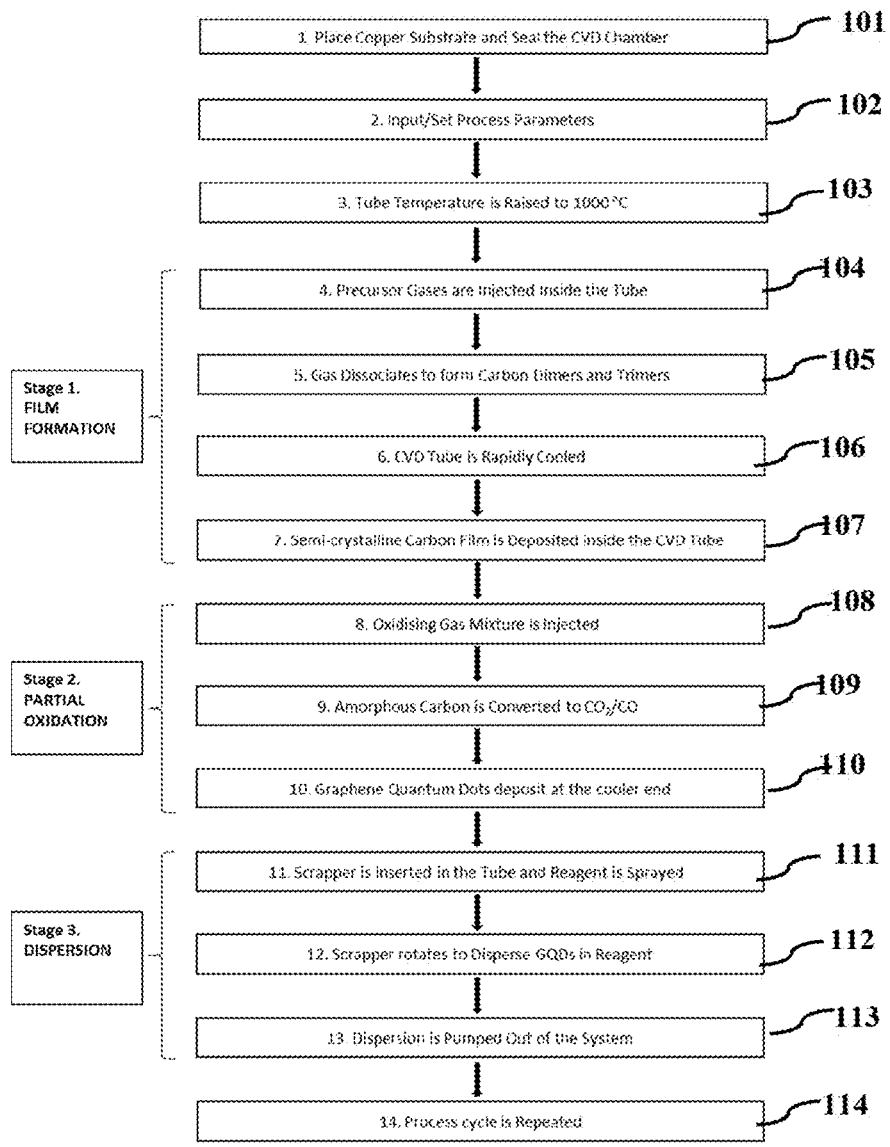
FIG. 1 illustrates a flow chart explaining a method for a synthesis of GQDs using CVD technique, according to an embodiment herein.

Although the specific features of the present invention are shown in some drawings and not in others. This is done for convenience only as each feature may be combined with any or all of the other features in accordance with the present invention.

DETAILED DESCRIPTION OF THE EMBODIMENTS HEREIN

In the following detailed description, a reference is made to the accompanying drawings that form a part hereof, and in which the specific embodiments that may be practiced is shown by way of illustration. These embodiments are described in sufficient detail to enable those skilled in the art to practice the embodiments and it is to be understood that other changes may be made without departing from the scope of the embodiments. The following detailed description is therefore not to be taken in a limiting sense.

The various embodiments of the present invention provide a process for synthesis of high purity Graphene Quantum Dots (GQDs) by using Chemical Vapor Deposition (CVD) technique which is a high throughput process.

The embodiments herein provide a system and a method for a synthesis of high purity Graphene Quantum Dots (GQDs) using Chemical Vapor Deposition (CVD) technique which is a high throughput process.

According to one embodiment herein, the method for the synthesis of high purity Graphene Quantum Dots (GQDs) comprises three broad stages/major processes. The three stages/processes include a Film Formation Stage process, Partial Oxidation of film process/stage, and Dispersion of GQDs process/stage. These stages/processes are executed/performed in succession automatically, so that the entire synthesis method of GQDs carried out in a continuous and automatic manner in the CVD Chamber.

According to one embodiment herein, the method for the synthesis of high purity Graphene Quantum Dots (GQDs) using CVD technique is provided. A strip of catalytic substrate such as Cu or Ni substrate is placed inside the CVD tube/chamber and the CVD Chamber is sealed to start a film formation process. Then the required process parameters for a CVD process are setup. The CVD tube/chamber is heated to a temperature 1000° C.-1100° C. by a furnace element. The CVD tube/chamber is maintained under a vacuum condition of up to 1 torr by a vacuum line. A mixture of precursor gases is injected into the CVD tube/chamber through a gas injection end (gas injection port). According to an embodiment herein, the mixture of Carbonaceous gases is injected into the CVD tube/Chamber. The mixture of carbonaceous gases is a mixture of gases selected from a group consisting of Methane, Acetylene, propane mixed with Hydrogen and Argon. The Carbonaceous gases are dissociated under temperature and pressure to form carbon dimers and carbon trimmers. The furnace elements are switched off and the insulation formed around the furnace insulation is removed to cool the CVD tube/chamber rapidly. The carbon dimers and carbon trimmers start to condense on the Cu or Ni substrate to form a semi-crystalline carbon film/coating upon a cooling of the CVD tube/chamber. The semi-crystalline carbon film is deposited inside the CVD tube/chamber upon cooling. This semi-crystalline carbon film has a short range in the order/terms of crystallinity, having small graphite regions embedded into an amorphous matrix. The Furnace Elements are switched on again to maintain a temperature of the CVD tube/chamber in the range of 600-900° C. during a partial oxidation of film process. An oxidizing gas mixture containing a mixture of Oxygen gas and Argon gas is injected into the CVD Tube/chamber to oxidize the amorphous regions of the semi-crystalline carbon film, to convert amorphous Carbon in semi-crystalline carbon film into CO2/CO thereby leading to a formation GQDs. The GQDs, thus formed, are carried with the gas flow and are deposited in the fan-cooled end/region of CVD tube/chamber thereby forming a GQD Film. A Scrapper coupled with a reagent hose and a dispersion hose are inserted into a Gas Exit End of the CVD tube/chamber during a film dispersion process. A dispersion reagent is pumped into the CVD tube/chamber from the Reagent Tank with the reagent hose and the reagent is sprayed on the GQD Film. According an embodiment herein, the reagent is selected from a group consisting of water, ethanol, acetone, and a mixture thereof. The scrapper is now rotated to disperse the GQDs in the reagent solution. The dispersed GQDs are pumped out into the Dispersion Tank through the Dispersion Hose. The entire process is then repeated starting from Film Formation Stage to dispersion stage to obtain continuous supply of GQDs.

According to one embodiment herein, the GQDs are directly obtained in the dispersion form by dissolution of GQDs layer, which is deposited in the cooled end/region of the CVD tube/chamber at the end of partial oxidation process, using analytical reagents like water, ethanol, acetone, etc. or mixture thereof. Therefore, there is no need for further purification of this dispersion and is ready for use in subsequent applications. The GQDs so obtained have a narrow size distribution in terms of their sheet diameter.

According to one embodiment herein, the pressure within the CVD Chamber/tube during the Film Formation process is maintained between 1 to 100 torr, which is substantially higher than the conventional CVD process for graphene synthesis. This enables a higher concentration of dissociated carbon dimers and trimers within the CVD tube. The disassociated carbon dimers and carbon trimers are condensed on the walls of the CVD tube upon rapid cooling of the CVD tube to form a carbon film. The carbon film so formed is semi-crystalline in nature and is an intermediate product of the process.

According to one embodiment herein, the carbon film deposited within the CVD tube is partially oxidized using very low flow rate of Oxygen gas (02) under vacuum conditions leading to a conversion of amorphous carbon regions in the film into CO or CO2, and a deposition of crystalline portions of the film as GQDs at the cooled ends/regions of the CVD tube/chamber.

According to an embodiment herein, a system for synthesizing for the synthesis of high purity Graphene Quantum Dots (GQDs) using CVD technique is provided. The system comprises a CVD Apparatus provided with Quartz Tube or CVD Tube/Chamber having a Gas Injection End and a gas exit end. The tube is surrounded by Furnace/Heating Elements. A Furnace Insulation pad is formed around the furnace heating elements. The furnace insulation pads are retracted/removed mechanically or manually. The gas exit end of the CVD tube is provided with a cooled region. The cooled region is cooled by a fab or by circulating coolants around the region. A scrapper is provided inside the CVD tube at the gas exit end and are rotated mechanically. The scrapper is coupled with a reagent supply hose and a dispersion hose. The regent supply hose and the dispersion hose are arranged coaxially. The regent supply hose and the dispersion hose are connected to a reagent supply tank and to a GQD dispersion tank respectively.

According to an embodiment herein, a strip of catalytic substrate is placed in the CVD tube/Chamber. According to an embodiment herein, the catalytic substrate is Cu or Ni. The chamber is then sealed with lids to carry out a film formation process a partial oxidation process of the film. Then the required process parameters for a CVD process are setup. The process parameters includes maintain a temperature of the tube at 1100° C. and a vacuum pressure of 0.1-100 torr inside the CVD tube/chamber. According to an embodiment herein, the Furnace Elements are activated to heat up the CVD Chamber/tube up to temperature of 1100° C. The CVD tube/chamber is maintained under a vacuum condition of 0.1-100 torr by a vacuum line.

According to an embodiment herein, precursor gases are injected from the gas injection end of the tube and the exit gases are pumped out of the CVD Tube through a Vacuum Line End. A mixture of precursor gases is injected into the CVD tube/chamber through a gas injection end (gas injection port). According to an embodiment herein, the mixture of Carbonaceous gases is injected into the CVD tube/Chamber. The mixture of carbonaceous gases is a mixture of gases selected from a group consisting of Methane, Acetylene, propane mixed with Hydrogen and Argon. The Carbonaceous gases are dissociated under temperature and pressure to form carbon dimers and carbon trimmers. The furnace elements are switched off and the insulation formed around the furnace insulation is removed to cool the CVD tube/chamber rapidly. The carbon dimers and carbon trimmers start to condense on the Cu or Ni substrate to form a semi-crystalline carbon film/coating upon a cooling of the CVD tube/chamber. The semi-crystalline carbon film is deposited inside the CVD tube/chamber upon cooling. This semi-crystalline carbon film has a short range in the order/terms of crystallinity, having small graphite regions embedded into an amorphous matrix.

According to an embodiment herein, the Furnace Elements are switched on again to maintain a temperature of the CVD tube/chamber in the range of 600–900° C. during a partial oxidation of film process. An oxidizing gas mixture containing a mixture of Oxygen gas and Argon gas is injected into the CVD Tube/chamber to oxidize the amorphous regions of the semi-crystalline carbon film, to convert amorphous Carbon in semi-crystalline carbon film into $CO_2/CO$ thereby leading to a formation GQDs. The GQDs, thus formed, are carried with the gas flow and are deposited in the fan-cooled end/region of CVD tube/chamber thereby forming a GQD Film.

According to an embodiment herein, the Scrapper coupled with a reagent hose and a dispersion hose are inserted into a Gas Exit End of the CVD tube/chamber during a film dispersion process. A dispersion reagent is pumped into the CVD tube/chamber from the Reagent Tank through the reagent hose and the reagent is sprayed on the GQD Film. According an embodiment herein, the reagent is selected from a group consisting of water, ethanol, acetone, and a mixture thereof. The scrapper is now rotated to disperse the GQDs in the reagent solution. The dispersed GQDs are pumped out into the Dispersion Tank through the Dispersion Hose. The entire process is then repeated starting from Film Formation Stage to dispersion stage to obtain continuous supply of GQDs.

According to an embodiment herein, the cooled region/end of the CVD tube/chamber is cooled with the external fan or by circulating a coolant around the cooled region/end of the tube.

According to an embodiment herein, the cooled region/end of the CVD tube/chamber is cooled with the external fan or by circulating a coolant around the cooled region/end of the tube.

According to an embodiment herein, the purity level of graphene quantum dots with the system and method is more than 90%.

According to an embodiment herein, a thickness of the pure graphene quantum dots is 0.5 to 4 nm and a surface diameter of the pure graphene quantum dots is 2 to 80 nm.

According to an embodiment herein, the GQDs so obtained have narrow size distribution in terms of their sheet diameter with less than 20% tolerance in desired size.

FIG. 1 illustrates a flow chart explaining a method for a synthesis of GQDs using CVD technique, according to an embodiment herein. With respect to FIG. 1, Cu substrate is placed inside the CVD tube, and the CVD Chamber is sealed (Step 1). The process parameters are set up for CVD process inside the CVD tube/chamber to carry out a film formation process and a partial oxidation of the film formed inside the CVD tube/chamber (Step 2). The CVD tube I heated to a temperature of 1000° C. using heating furnace elements placed around the CVD tube (Step 3). A mixture of precursor gases are injected inside the CVD tube. According to an embodiment herein, the mixture precursor gases is a mixture of Carbonaceous gases selected from a group consisting of Methane, Acetylene, propane mixed with Hydrogen and Argon (Step 4). The Carbonaceous gases are dissociated to form carbon dimers and trimmers (Step 5). The CVD tube is cooled rapidly by switching off the heating furnace elements and by removing the insulation pads formed around the CVD tube over the heating furnace elements. The CVD tube is cooled further with an external cooling fan and by circulating coolants around the CVD tube (Step 6). Semi-crystalline carbon film is formed and deposited inside the CVD tube in the cooled end/region of the CVD tube, upon cooling (Step 7). An oxidizing gas mixture is injected into the CVD tube. According to an embodiment herein, the oxidizing gas mixture is a mixture of oxygen with Argon (Step 8). Amorphous C in semi-crystalline carbon film is converted into $CO_2/CO$ to form GQDs. The GQDs, thus formed, are carried with the gas flow and are deposited in the fan-cooled end/region of CVD tube/chamber thereby forming a GQD Film (Step 9). The Graphene Quantum Dots (GQDs) so formed are carried with the gas flow and deposited at the cooled end/region of the tube (Step 10). The scrapper assembly is inserted in the CVD tube and the reagent is sprayed inside the CVD tube (Step 1). The scrapper is rotated to disperse these GQDs in the reagent (Step 12). Further, the GQD dispersion is pumped out of the CVD Chamber/tube (Step 13). The entire above process is repeated to obtain a continuous supply of GQDs (Step 14).

Figure 2:
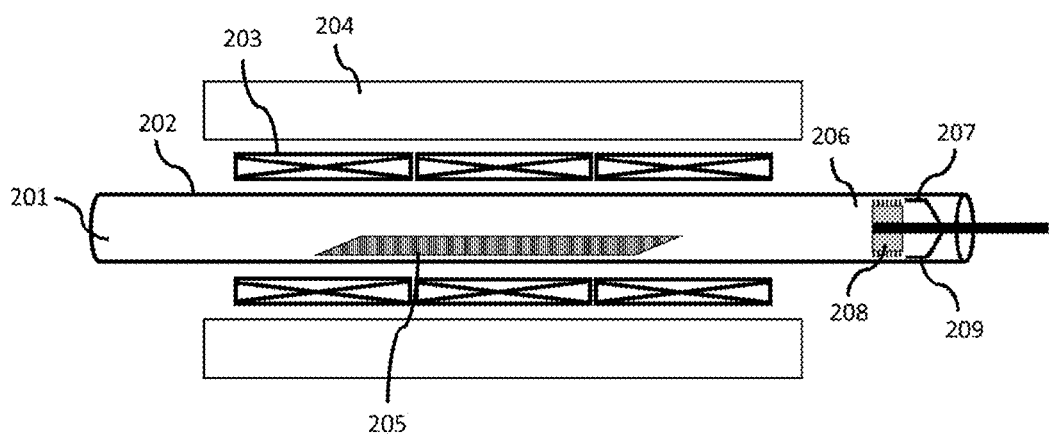
FIG. 2 illustrates a side view of the CVD apparatus used in the synthesis of GQDs using CVD technique, according to an embodiment herein.

FIG. 2 illustrates a side view of the CVD apparatus used in the synthesis of GQDs using CVD technique, according to an embodiment herein. With respect to FIG. 2, the CVD Apparatus comprises of Gas Injection End 201, Quartz Tube or CVD Tube/Chamber 202, Furnace/Heating Elements 203, mechanically retractable Furnace Insulation 204, Catalyst Substrate 205, Gas Exit End/Vacuum Line End 206, Reagent Spray Hose 207, Scrapper 208, Dispersion Hose 209. Firstly, the strip of catalytic substrate 205 i.e., either Cu or Ni is placed in the CVD Chamber 202. The chamber is then sealed for Stage 1 and Stage 2 to happen. The Furnace Elements 203 heat up the CVD Chamber 202 up to temperature of 1100° C. Precursor gases are inlet from gas injection end 201 of the tube and the exit gases are pumped out of the CVD Tube 202 via Vacuum Line End 206. Reagent Hose 207 sprays reagent inside the CVD Tube 202 and the Dispersion Hose 209 pumps out the GQD dispersion from the CVD Tube 202, both hoses are coaxially coupled with the Scrapper 208. Scrapper 208 is put inside the CVD Chamber 202 at the Gas Exit End 206 for Stage 3 only.

Figure 3A:
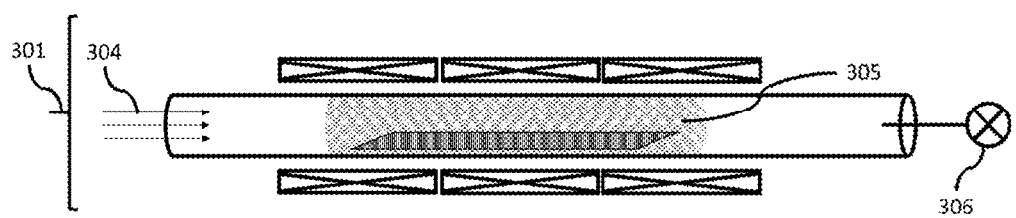
FIG. 3A illustrates a side view of the CVD apparatus used in the synthesis of GQDs indicating a film formation process, according to an embodiment herein.
Figure 3B:
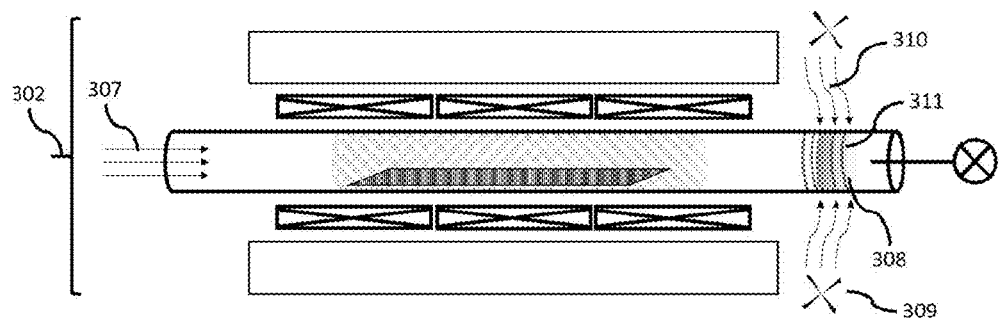
FIG. 3B illustrates a side view of the CVD apparatus used in the synthesis of GQDs indicating a partial oxidation process of film, according to an embodiment herein.
Figure 3C:
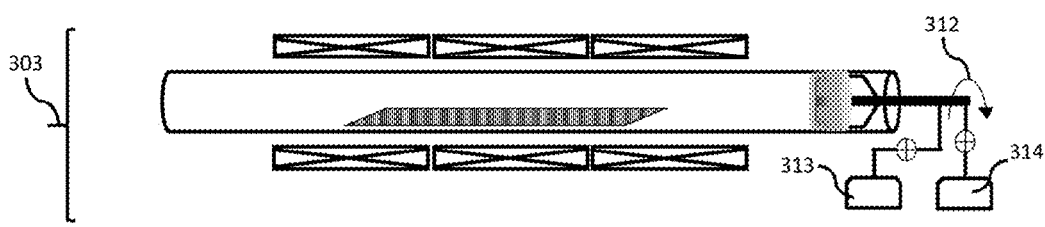
FIG. 3C illustrates a side view of the CVD apparatus used in the synthesis of GQDs indicating GQD film dispersion process, according to an embodiment herein.

FIG. 3A-FIG. 3C illustrate a side view of the CVD apparatus used in the synthesis of GQDs indicating a film formation process, a partial oxidation process of film and a dispersion process, according to an embodiment herein. With respect to FIG. 3, the detailed synthesis of GQDs in the CVD Apparatus comprises three reaction/synthesis stages. The three stages are Film Formation Stage 301, Partial Oxidation Stage 302, and Dispersion Stage 303. Formation Stage 301 involves injection of Precursor Gases 304, formation of Semi-Crystalline Carbon Film/Coating 305 and maintain a vacuum with a Vacuum Line 306. Partial Oxidation Stage 302 involves Oxidising Gas Mixture 307, GQD Deposition 308 and a cooling system that involves either a Fan 309 and Cooling Air 310 or a Cooling Coil for external coolant circulation 311 for cooling the CVD tube with Fan 308 or by circulating a coolant around the CVD tube externally. Dispersion Stage 303 involves Rotation of Scrapper 312, supply of reagent from Reagent Tank 313 through reagent hose and transfer of GQD dispersion to GQD Dispersion Tank 314 through dispersion hose.

According to one embodiment herein, a continuous cyclic process for synthesis of high purity GQDs Dispersion is illustrated. After the CVD Chamber 202 is sealed with Catalyst Substrate 205 inside, the Film Formation Stage 301 is initiated. The Precursor Gases 304 which is a combination of Carbon Precursor Gas like Methane, Acetylene or Propane with Hydrogen is injected into the CVD Chamber 202 in which vacuum is maintained by Vacuum Line 306 of up to 1 torr. The Catalyst Substrate 205 placed inside the CVD tube provides a surface for association of carbon dimers and trimers formed by the dissociation of Precursor Gases 304 under the presence of Hydrogen at temperatures of up to 1100° C. maintained by Furnace Elements 203. These carbon dimers and trimers are condensed to form Semi-Crystalline Carbon Film/Coating 305 when the Furnace Elements 203 is switched off and Furnace Insulation 204 is removed mechanically or manually for rapid cooling of the CVD Tube 202. This Semi-Crystalline Carbon Film has a short range in terms of crystallinity, having small graphitic regions embedded into amorphous matrix. In Partial Oxidation Stage 302, the Furnace Elements 203 are switched on again to maintain temperature in the range of 600-900° C. Oxidizing Gas Mixture 307 containing a mix of Oxygen gas and Argon gas is injected into the CVD Tube 202 to oxidize the amorphous regions of The Semi-Crystalline Film 305, thereby leading to formation of suspended GQDs which are carried with gas flow and get deposited in the Fan Cooled 310 or coolant cooled 311 region of the CVD Tube to form a GQD Film 308. After, the Semi-Crystalline Film is completely converted to GQDs, the CVD Chamber is again cooled down. In Dispersion Stage 303, the Scrapper 208 with coaxially coupled reagent hose 207 and Dispersion Hose 209 are inserted into the Gas Exit End 206. The Reagent Hose 207 is used to pump dispersion reagent which is either water, ethanol, acetone, etc., or a mixture thereof, from the Reagent Tank 313 and the reagent is sprayed on the GQD Film 310. The Scrapper 208 is rotated to disperse the GQDs in the reagent. The Dispersion Hose 209 is used to pump out the dispersed GQDs into the Dispersion Tank 314. The entire process is then repeated starting from Film Formation Stage to obtain a continuous supply of GQDs at a purification level of more than 90%.

Although the embodiments herein are described with various specific embodiments, it will be obvious for a person skilled in the art to practice the embodiments herein with modifications.

The system and method for the synthesis of GQDs disclosed in the embodiments herein have several exceptional advantages over existing techniques for GQDs synthesis. Firstly, this method is a continuous, clean, cost effective and industrially viable process. Secondly, GQDs obtained using this method is highly pure and have narrow particle size distribution in terms of sheet thickness and surface diameter. Thirdly, the method does not require any corrosive acids/reagents for synthesis. Fourthly, this method does not involve use of high-end, sophisticated instruments or source. Lastly, the process is tunable, by adjusting/modifying the process parameters the properties of GQDs easily.

The foregoing description of the specific embodiments will so fully reveal the general nature of the embodiments herein that others can, by applying current knowledge, readily modify and/or adapt for various applications such as specific embodiments without departing from the generic concept, and, therefore, such adaptations and modifications should and are intended to be comprehended within the meaning and range of equivalents of the disclosed embodiments.

It is to be understood that the phraseology or terminology employed herein is for the purpose of description and not of limitation. Therefore, while the embodiments herein have been described in terms of preferred embodiments, those skilled in the art will recognize that the embodiments herein can be practiced with modifications. However, all such modifications are deemed to be within the scope of the claims.

What is claimed is:

1. A method for synthesis of Graphene Quantum Dots (GQDs) using a chemical vapor deposition (CVD) apparatus, the method comprises steps of:
   placing a catalytic substrate inside a chemical vapor deposition (CVD) tube in the CVD apparatus, and wherein the catalytic substrate is a copper substrate or nickel substrate;
   sealing both ends of the CVD tube after placing the catalytic substrate;
   pre-processing the CVD tube to set up process parameters inside the CVD tube for conducting a CVD process, and wherein the process parameters include a temperature of 1000° C.-1100° C. and a pressure of 0.1-100 torrs;
   injecting a carbon precursor gas inside the sealed CVD tube, and wherein the carbon precursor gas is a mixture of carbonaceous gases, and wherein the carbonaceous gases are selected from the group consisting of methane, acetylene, propane, and are mixed with hydrogen and argon;
   disassociating the mixture of carbonaceous gases under temperature and pressure to form carbon dimer and carbon trimers;
   cooling the CVD tube to deposit semi-crystalline carbon film inside the CVD tube, and wherein the carbon dimers or carbon trimers are condensed on the Cu or Ni substrate to form a semi-crystalline carbon film upon the cooling of the CVD tube;
   heating the CVD tube again to initiate a partial oxidation of semi-crystalline carbon film formed inside the CVD tube;

injecting an oxidizing gas mixture into the CVD tube to partially oxidize a plurality of amorphous regions of the semi-crystalline carbon film using a reduced flow rate of oxygen under vacuum to convert an amorphous carbon in semi-crystalline carbon film into carbon dioxide and/or carbon monoxide to deposit crystalline portions of the semi-crystalline carbon film as a plurality of GQDs at a cooled region of the CVD tube, and wherein the oxidizing gas mixture comprises a mixture of oxygen gas and argon gas;

inserting a scrapper assembly into a gas exit end of the CVD tube during a film, dispersion process to disperse the deposition of the plurality of GQDs, and wherein the scrapper assembly comprises a scrapper coupled with a reagent hose and a dispersion hose, and wherein the reagent hose and the dispersion hose are coupled to the scrapper coaxially, and wherein the reagent hose and the dispersion hose are coupled to a reagent tank and to a GQDs dispersion tank respectively;

pumping a dispersion reagent into the CVD tube from the reagent tank through the reagent hose to spray the reagent on the plurality of GQDs;

rotating the scrapper to disperse the plurality of GQDs in the reagent solution;

pumping out the plurality of dispersed GQDs from the CVD tube into the GQDs dispersion tank through the dispersion hose; and repeating all the above-mentioned method steps to obtain a continuous supply of the plurality of GQDs, and wherein a purity level of the plurality of GQDs obtained is more than 90%.

2. The method, according to claim 1, wherein the step of pre-processing the CVD tube to set up the process parameters inside CVD tube for conducting a CVD process comprises heating the CVD tube to a temperature of 1000° C.-1100° C. with a plurality of heating furnace elements and creating a vacuum pressure of 0.1-100 torrs with a vacuum line connected to the CVD tube.

3. The method according to claim 1, wherein the step of cooling the CVD tube to deposit semi-crystalline carbon film inside the CVD tube comprises removing a plurality of heating furnace elements placed around the CVD tube, and wherein a plurality of furnace insulation pads are placed around the plurality of heating furnace elements, and wherein a plurality of furnace insulation pads arranged around the heating furnace elements are withdrawn mechanically or manually to cool the CVD tube.

4. The method according to claim 1 further comprises cooling the CVD tube using cooling fans and by circulating coolants externally to form the semi-crystalline carbon in walls of the CVD tube/chamber, and wherein the carbon dimers and carbon trimers are condensed on the Cu or Ni substrate to form a semi-crystalline carbon film upon the cooling of the CVD tube.

5. The method according to claim 1, wherein CVD tube is heated again to a temperature of 600-900° C. during partial oxidation of film process with a plurality of heating furnace elements.

6. The method according to claim 1, wherein the dispersion reagent is selected from a group consisting of water, ethanol, acetone, and mixture thereof.

* * * * *